United States Patent
Yang et al.

(10) Patent No.: US 9,089,007 B2
(45) Date of Patent: Jul. 21, 2015

(54) METHOD AND APPARATUS FOR SUBSTRATE SUPPORT WITH MULTI-ZONE HEATING

(71) Applicants: Yao-Hung Yang, Santa Clara, CA (US); Jeonghoon Oh, San Jose, CA (US); Frank F. Hooshdaran, Pleasanton, CA (US); Tom K. Cho, Los Altos, CA (US); Tao Hou, Palo Alto, CA (US)

(72) Inventors: Yao-Hung Yang, Santa Clara, CA (US); Jeonghoon Oh, San Jose, CA (US); Frank F. Hooshdaran, Pleasanton, CA (US); Tom K. Cho, Los Altos, CA (US); Tao Hou, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 172 days.

(21) Appl. No.: 13/766,885

(22) Filed: Feb. 14, 2013

(65) Prior Publication Data
US 2013/0284721 A1    Oct. 31, 2013

Related U.S. Application Data

(60) Provisional application No. 61/639,781, filed on Apr. 27, 2012.

(51) Int. Cl.
*H05B 3/10* (2006.01)
*H05B 3/12* (2006.01)
*H01L 21/67* (2006.01)
*H05B 1/02* (2006.01)
*F26B 19/00* (2006.01)

(52) U.S. Cl.
CPC ............ *H05B 3/12* (2013.01); *H01L 21/67103* (2013.01); *H01L 21/67248* (2013.01); *H05B 1/0233* (2013.01)

(58) Field of Classification Search
USPC .......... 219/390, 405, 411, 553; 392/416, 418; 118/724–5, 50.1, 728–30
See application file for complete search history.

(56) References Cited

U.S. PATENT DOCUMENTS

| | | | |
|---|---|---|---|
| 5,844,205 A | 12/1998 | White et al. | |
| 6,035,101 A | 3/2000 | Sajoto et al. | |
| 6,639,189 B2 * | 10/2003 | Ramanan et al. | 219/444.1 |
| 6,646,235 B2 | 11/2003 | Chen et al. | |
| 7,279,661 B2 | 10/2007 | Okajima et al. | |
| 8,075,729 B2 | 12/2011 | Holland et al. | |
| 8,226,769 B2 | 7/2012 | Matyushkin et al. | |
| 2011/0147363 A1 * | 6/2011 | Yap et al. | 219/385 |

OTHER PUBLICATIONS

PCT international search report and written opinion of PCT/US2013/027824 dated Jun. 14, 2013.

* cited by examiner

*Primary Examiner* — Shawntina Fuqua
(74) *Attorney, Agent, or Firm* — Patterson & Sheridan, LLP (57) ABSTRACT

Methods and substrate processing systems are provided for controlling substrate heating efficiency and generating a desired temperature profile on the surface of a substrate when the substrate is disposed on a substrate support surface of a substrate support assembly. The substrate support assembly is provided with minimum software control and hardware requirement and includes a heating element comprised of multiple heating elements sections. The heating element is connected to a power source for adjusting the temperature outputs of the multiple heating element sections and providing adjustable multi-heating zones and desired temperature distribution over the substrate support surface of the substrate support assembly within a process chamber.

20 Claims, 4 Drawing Sheets

METHOD AND APPARATUS FOR SUBSTRATE SUPPORT WITH MULTI-ZONE HEATING

BACKGROUND OF THE INVENTION

1. Field of the Invention

Embodiments of the invention generally relate to methods and apparatus for forming semiconductor devices. More particularly, embodiments of the invention relate to methods for processing a semiconductor substrate.

2. Description of the Related Art

In the field of integrated circuit and flat panel display fabrication, multiple deposition and etching processes are performed in sequence on the substrate within one or more process chambers of a substrate processing system to form various device design structures. Processes such as etching, physical vapor deposition (PVD), chemical vapor deposition (CVD), chamber cleaning, substrate polishing, and conditioning, etc. are well known in the industry and each process often requires appropriate ways to heat a substrate (e.g., a silicon substrate) disposed within the process chamber.

Figure 1A:
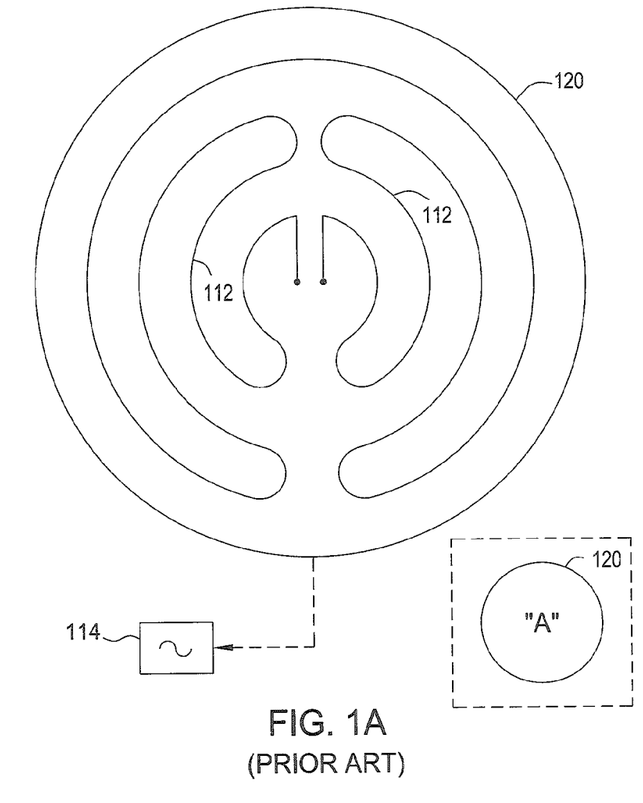
FIG. 1A is a schematic top-view diagram of an illustrative conventional single zone substrate support assembly.

In general, a silicon substrate (e.g., wafers or glass substrates) is transferred onto a substrate support surface of a substrate support assembly (e.g., a susceptor) inside the process chamber. FIG. 1A illustrates a top view of a substrate support surface of a substrate support assembly 120 within a process chamber. The substrate support assembly 120 may include a heating pedestal having a single heating element 112 embedded therein and connected to an input end and an output end of a power source 114.

The small box in FIG. 1A illustrates that the use of the single heating element 112 generates a single heating zone "A" on the substrate support surface of the substrate support assembly 120. However, because different portions of a substrate may have different heat loss when disposed on the substrate support assembly 120, the use of a single heating zone "A" to heat the surface of a substrate disposed thereon often results in uneven temperature distribution among the center portions and the outer edge portions of the substrate surface. In another words, after a substrate is disposed on the surface of the substrate support assembly 120 and heated by turning on the power source 114, the resulting temperature profile on a substrate surface is often not uniform. It was found that the edge portions of the substrate surface will lose heat easily being at lower temperatures than the center portions. The within-wafer temperature non-uniformity can vary up to 6-8 degrees Celsius.

Figure 1B:
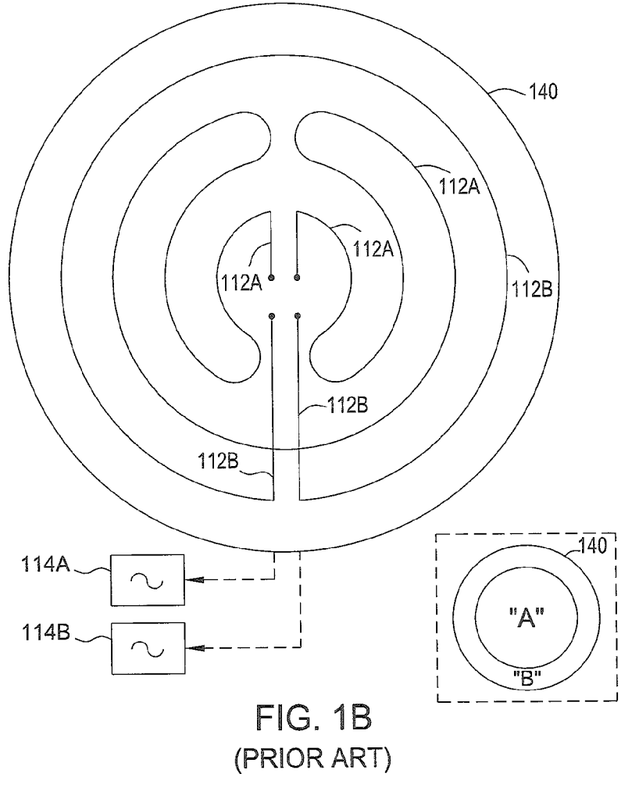
FIG. 1B is a schematic top-view diagram of another illustrative conventional dual-zone substrate support assembly.

FIG. 1B illustrates a top view a surface of another prior art substrate support assembly 140. The substrate support assembly 140 may include two (2) heating elements 112A, 112B embedded therein and connected to the input ends and the output ends of two (2) power sources 114A, 114B, respectively to improve the within-wafer temperature non-uniformity as discussed above. The small box in FIG. 1B represents two (2) heating zones "A" and "B" on the surface of such prior art substrate support assembly 140, when the two heating elements 112A, 112B are employed. The heating zone "B" generally use higher electrical power input from the power source 114B in order to compensate heat loss on the outer edge portions of the surface of a substrate, when the substrate is disposed on the substrate support surface of such prior art substrate support assembly 140.

However, when multiple heating elements (at least two heating elements are shown in FIG. 1B to generate two heating zone "A" and "B") are used to generate multiple temperature heating zones (multi-zones) in such prior art substrate support assembly 140, multiple power controllers, multiple cables, and multiple power sources (at least two power sources 114A, 114B are shown in FIG. 1B) must be coupled to these heating elements. At least one power controller and one power source need to be dedicated to each heating element. Thus, the design of such multi-zone substrate support assembly 140 represents undesirable large burdens on software control and hardware design.

Further, when multiple power sources are used to adjust heating temperature outputs of these heating elements, mechanically, each power source would require at least two times (2x) the number of electric cables and mechanical accessory hardware (e.g., at least one input line/end and at least another output line/end for each power source are connected to each heating element). All of these power input and output lines/ends have to be packed inside a support pedestal (e.g., a shaft) of the substrate support assembly, making the pedestal design too bulky and increasing mechanical design burdens. Thus, there is a need for a substrate support assembly with reduced mechanical parts and simple mechanical design.

Still further, the output temperatures among the different temperature zones of such multi-zone substrate support assembly 140 are controlled by fixed electric inputs of the power sources (with each power source connected to each heating element in each zone) and are often difficult to adjust all of them once substrate processing has started. Thus, there is a need for a substrate support assembly capable of adjusting heating outputs in wide temperature ranges and multiple heating zones during substrate processing.

Therefore, there is a need for an improved substrate support assembly with simple heating element design and improved substrate heating efficiency, and still capable of adjusting its surface temperature among multiple adjustable heating zones within a substrate support assembly of a substrate processing system.

SUMMARY OF THE INVENTION

Methods and systems for controlling the temperature of a surface of a substrate disposed on the substrate support surface of a substrate support assembly of a process chamber are provided. In one aspect, a substrate support assembly with minimum heating element design (e.g., a single heating element connected to one power source and capable of adjusting its surface temperature into multiple temperature adjustable heating zones) is provided. One single heating element can be used to be embedded and distributed in a desirable pattern inside the substrate support assembly with improved substrate heating efficiency and a desired output temperature distribution profile across the substrate support surface.

In one embodiment, a substrate support assembly of a substrate process chamber includes a support member having a substrate support surface, and a heating element having two or more heating element sections. the heating element sections are connected together in one electrical loop, and each heating element section responds independently and differently to an input power of a power source connected to the heating element. In another embodiment, the heating element is provided to heat the substrate support surface in two or more heating zones, and each heating element section of the heating element is independently configured to heat each heating zone on the substrate support surface of the support member.

In another aspect, a substrate process chamber includes a substrate support assembly disposed inside the substrate process chamber, where the substrate support assembly includes a support member having a substrate support surface, and a heating element having two or more heating element sections. The heating element sections are connected together in one electrical loop, and each heating element section responds independently and differently to an input power of a power source connected to the heating element. In one embodiment, each heating element section responds to an input power frequency, and the output temperature of the substrate support surface is determined by adjusting two or more input power frequencies of the power source.

In still another aspect, a method for controlling the temperature of a surface of a substrate disposed on the surface of a substrate support assembly is provided. The method includes heating the surface of the substrate disposed in a process chamber by heating a substrate support surface of a substrate support assembly having the substrate disposed thereon. The substrate support assembly includes a heating element having two or more heating element sections. The heating element sections are connected together in one electrical loop, and each heating element section responds differently to an input power of a power source connected to the heating element. The method further includes determining a responding power input resonant frequency in the two or more heating element sections of the heating element, and applying the responding power input resonant frequency to the power source connected to the heating element. In one embodiment, the method includes flowing a cooling medium circulated through a fluid channel embedded within the substrate support assembly to further control the temperature on the substrate support surface.

In another embodiment, the amplitude of each responding power input resonant frequency for each heating element section is adjusted during substrate processing. In still another embodiment, a desired output temperature distribution across two or more heating zones on the substrate support surface of the substrate support assembly are obtained by independently heating each heating element section of the heating element, wherein each heating element section correspond to each of two or more heating zones on the substrate support surface.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention provide methods and systems for controlling the temperature of a surface of a substrate disposed on a substrate support surface of a substrate support assembly. The substrate support assembly is disposed in a process chamber or a substrate processing system and generally includes a minimal number of heating elements connected to one or more power sources. The heating elements and the power sources are configured to control and adjust the surface temperature of the substrate support surface of the substrate support assembly into multiple temperature adjustable heating zones. For example, a single heating element (e.g., one single heating element loop with a single pair of power input and output leads) can be used to be embedded inside a support member of the substrate support assembly to define and control temperature adjustable heating zones. If multiple heating elements are utilized, the number of temperature adjustable heating zones exceed the number of heating elements utilized, thus reducing the number of heating elements needed as compared to conventional substrates supports having an equivalent number of heating zones.

In one or more embodiments, the heating elements within the substrate support surface of the support member are composed of multiple heating element sections (e.g., two or more heating element sections), which are manufactured and designed from different materials, sizes, and shapes, and/or distributed in different geometry or pattern and embedded within the support member to improve substrate heating efficiency. These heating element sections are connected together in one single electric loop and can be heated up independently with selected power inputs (or cooled down with reduced power inputs) to effect various desirable temperature profiles on the substrate support surface of the substrate support assembly, thereby resulting in multiple temperature-adjustable heating zones to heat a surface of a substrate disposed thereon. As will be explained in greater detail below, a method of independently controlling and adjusting the output temperatures of multiple heating elements sections of a heating element of a substrate support assembly is provided.

The term "substrate" as used herein generally includes any wafers, or other suitable glass, polymer, or metal substrates. A substrate may include a surface to be heated to a desirable temperature, preferably a desired temperature distribution profile across the surface of the substrate, during substrate processing when disposed inside a substrate process chamber. Moreover, the substrate is not limited to any particular size or shape. The substrate can be a round wafer having a 200 mm diameter, a 300 mm diameter, or other diameter. The substrate can also be any polygonal, square, rectangular, curved or otherwise non-circular work-piece, such as a polygonal glass substrate used in the fabrication of flat panel displays.

Each substrate surface may include one or more layers of materials that serve as a basis for subsequent processing operations. For example, the substrate can include one or more layers of conductive metals, such as aluminum, copper, tungsten, or combinations thereof. The substrate can also include one or more layers of nonconductive materials, such as silicon, silicon oxide, doped silicon, germanium, gallium arsenide, glass, and sapphire. The substrate can also include layers of dielectric materials, such as silicon dioxide, organosilicates, and carbon doped silicon oxides. Further, the substrate can include any other materials such as metal nitrides and metal alloys, depending on the application. In one or more embodiments, the substrate can form a gate structure including a gate dielectric layer and a gate electrode layer to facilitate connecting with an interconnect feature, such as a plug, via, contact, line, and wire, subsequently formed thereon.

Figure 2A:
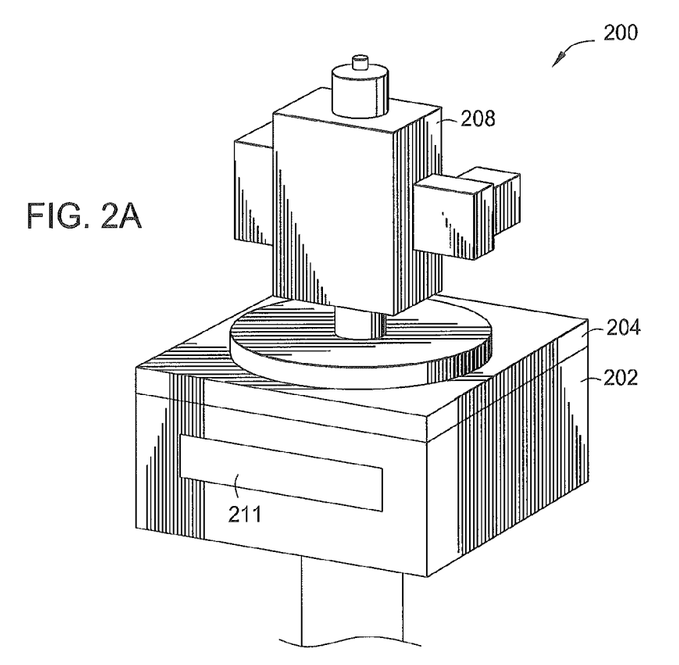
FIG. 2A is an overview of an illustrative process chamber having a substrate support assembly with multi-zone temperature-adjustable heating pedestal in accordance with one embodiment of the invention.

FIG. 2A illustrates an overview of one example of a process chamber 200 having a substrate support assembly with a multi-zone temperature-adjustable heating element suitable for heating a surface of a substrate as further described below in accordance with one embodiment of the invention. The process chamber 200 may generally include a chamber body 202, a lid assembly 204, and a substrate support assembly 240 (shown in FIG. 2B).

The chamber body 202 generally includes a slit valve opening 211 formed in a sidewall of the process chamber 200. The slit valve opening 211 is selectively opened and closed to provide access into the interior of the chamber body 202 by a wafer handling robot (not shown). The chamber body 202 may include a chamber liner that surrounds the substrate support assembly 240. The chamber liner may be removable for servicing and cleaning. The chamber liner can be made of a metal such as aluminum, a ceramic material, or any other process compatible material, and can be bead blasted to increase surface roughness and/or surface area which increases the adhesion of any material deposited thereon, thereby preventing flaking of material which results in contaminants of the process chamber 200. In addition, a pumping channel may be formed within the chamber liner Optionally, the chamber body 202 includes a channel formed therein such that a heat transfer fluid is flown therethrough. The heat transfer fluid can be a heating fluid or a coolant and is used to control the temperature of the chamber body 202 during substrate processing and substrate transfer. The temperature of the chamber body 202 is important to prevent unwanted condensation of the gas or byproducts on the chamber walls. Exemplary heat transfer fluids include water, ethylene glycol, or a mixture thereof. An exemplary heat transfer fluid may also include nitrogen gas.

The lid assembly 204 is disposed at and connected to an upper end of the chamber body 202, and the substrate support assembly 240 is at least partially disposed inside the chamber body 202 of process chamber 200. In some cases, a plasma source 208 is coupled to two electrodes disposed within the lid assembly 204 and configured to form a plasma volume or cavity therebetween within the process chamber 200. One electrode is grounded and another electrode is connected to a power source, such as an RF power supply, for forming a capacitance between the two electrodes. The lid assembly 140 can optionally include an isolator ring to electrically isolate the two electrodes.

Figure 2B:
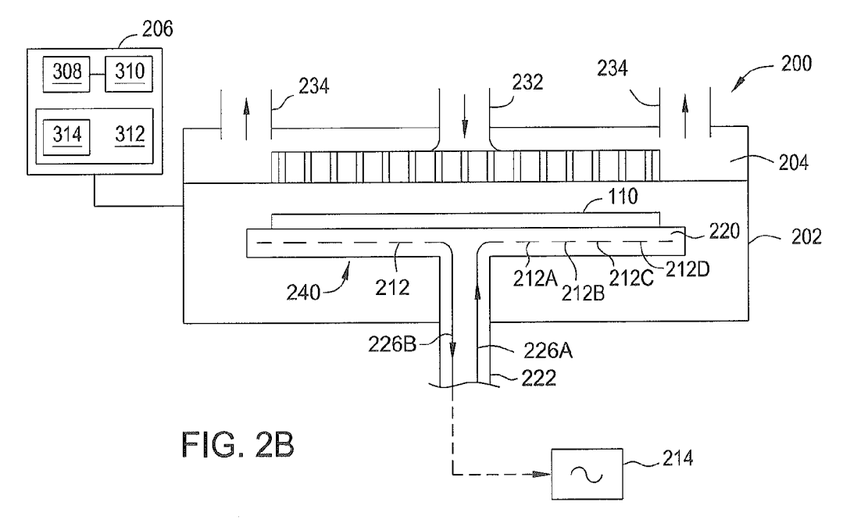
FIG. 2B is one embodiment of a cross-sectional view of the process chamber of FIG. 2A, illustrating a substrate support assembly with multi-zone temperature-adjustable heating pedestal (at least 4 exemplary heating elements capable of zones capable of being adjustable into three temperature zones on the surface of the substrate support assembly are shown).

FIG. 2B illustrates a cross-sectional view of the process chamber 200 having the lid assembly 204 and the substrate support assembly 240 disposed inside the chamber body 202. The process chamber 200 may be any type of process chamber, including etching chambers, physical vapor deposition (PVD) chambers, chemical vapor deposition (CVD) chambers, cleaning chambers, etc., where heating a surface of a substrate (e.g., a silicon substrate) disposed within the process chamber of a substrate processing system is involved. The process chamber 200 may be any substrate process chambers available from Applied Materials, Santa Clara, Calif. It is noted that other process chambers available from other manufactures may also be utilized to practice the present invention. It is also contemplated that the heating elements described herein may be utilized in other articles where a single heating element having multiple temperature adjustable heating zones of heating using a single Referring additionally to FIG. 2B, the lid assembly 204 may generally include one or more gas inlets and a shower head assembly (e.g., a shower head 232 is shown in FIG. 2B), connected thereto for flowing one or more gasses through gas inlets of the shower head 232 to near the surface of the substrate 110 disposed on the substrate support assembly 240. The process gases may enter the lid assembly 204 via the one or more gas inlets, which are in fluid communication with one or more gas sources and/or other gas delivery components, such as gas mixers, generally disposed outside of the chamber body 202. The lid assembly 204 may also include one or more gas outlets 234.

Optionally, the lid assembly 204 can include a distribution plate and a blocker plate for providing a controlled and evenly-distributed flow of gases through the shower head 232 onto the surface of the substrate 110 within the process chamber 200. The distribution plate may include one or more embedded channels or passages housing a heater or heating fluid to provide temperature control of the lid assembly 204. A resistive heating element (not shown) can be inserted within the channels to heat the distribution plate. A thermocouple can be connected to the distribution plate to regulate the temperature thereof. The thermocouple can be used in a feedback loop to control electric current applied to the heating element of the distribution plate.

Alternatively, a heat transfer medium or a cooling medium, if needed, can be passed through the channels of the distribution plate to better control the temperature of the distribution plate within the lid assembly 204, depending on the process requirements within the process chamber 200. Any heat transfer medium may be used, such as nitrogen, water, ethylene glycol, or mixtures thereof, for example. In addition, the lid assembly 204 can be heated using one or more heat lamps (not shown). Typically, the heat lamps are arranged about an upper surface of the distribution plate to heat the components of the lid assembly 204 including the distribution plate by radiation.

The process chamber 200 may include a vacuum pump and a throttle valve to regulate flow of gases inside the process chamber 200, flowing from gas sources via gas inlets disposed within the lid assembly 204 and the shower head 232, to a processing region on the surface of the substrate 110. The vacuum pump is coupled to a vacuum port disposed on the chamber body 202, and may also be connected or in fluid communication with the pumping channels of the chamber liner. Thus, the vacuum pump can be coupled to various mechanical chamber parts to provide an egress for any excess precursor gases or unwanted product gasses or contaminants generated within the process chamber 200. The terms "gas" and "gases" are used interchangeably, unless otherwise noted, and refer to one or more precursors, reactants, catalysts, carrier, purge, cleaning, combinations thereof, as well as any other fluid introduced into the chamber body 202.

As shown in FIG. 2B, the substrate support assembly 240 of the process chamber 200 may include a heating pedestal or a susceptor, which generally includes a shaft 222 and a support member 220. The shaft 222 extends through a centrally-located opening formed in a bottom surface of the chamber body 202 and is generally disposed vertically within the bottom portion of the chamber body to support the support member 220. The support member 220 has a substrate support surface to support a substrate 110 to be processed thereon within the chamber body 202 of the process chamber 200. For example, the support member 220 may have a flat or a substantially flat, circular or square surface for supporting a substantially circular or square substrate thereon. The support member 220 may be generally constructed of an aluminum material. Optionally, the support member 220 can include a removable top plate made of some other material, such as silicon or ceramic material, for example, to reduce backside contaminants of the substrate.

The shaft 222 is connected to a lift mechanism (not shown) disposed outside of the chamber body. The lift mechanism allows the support member 220 supported by the shaft 222 to be moved vertically (e.g., upwardly and downwardly) within the chamber body 202 between a substrate processing position and a lower substrate transfer position. The substrate transfer position of the support member 220 is slightly below the opening of the slit valve 211 formed in a sidewall of the chamber body 202. The lift mechanism can be flexibly sealed to the chamber body 202 by a bellow that prevents vacuum leakage from around the shaft 222. Accordingly, the substrate support assembly 240 of the process chamber 200 provides both heating and/or cooling of a substrate surface without breaking vacuum.

In one or more embodiments, the substrate 110 may be secured to the support member 222 using a vacuum chuck. In another embodiment, the substrate (not shown) may be secured to the support member 220 using an electrostatic chuck. An electrostatic chuck typically includes at least a dielectric material that surrounds an electrode (not shown), which may be located on an upper surface of the support member 220 or formed as an integral part of the support member 220. The dielectric portion of the electrostatic chuck electrically insulates the chuck electrode from the substrate 110 and from the remainder of the substrate support assembly 240.

The support member 220 can include one or more bores formed therethrough to accommodate one or more lift pins. Each lift pin is constructed of ceramic or ceramic-containing materials, and are used for substrate-handling and transport. The lift pins are moveable within its respective bore by engaging an annular lift ring disposed within the chamber body 202. The lift ring is movable such that the upper surface of the lift pins can be located above the substrate support surface of the support member 220 when the lift ring is in an upper substrate processing position. Conversely, the upper surface of the lift-pins is located below the substrate support surface of the support member 220 when the lift ring is in a lower substrate transfer position. Thus, part of each lift-pin passes through its respective bore within the support member 220 when the lift ring moves from the lower transfer position to the upper processing position.

The support assembly 220 can further include an edge ring (not shown) disposed about the support member 220. The edge ring is an annular member that is adapted to cover an outer perimeter of the support member 220 and protect the support member 220 from deposition. The edge ring can be positioned on or adjacent the support member 220 to form an annular purge gas channel between the outer diameter of support member 220 and the inner diameter of the edge ring. The annular purge gas channel can be in fluid communication with a purge gas conduit formed through the support member 220 and the shaft 222. The purge gas conduit is in fluid communication with a purge gas supply (not shown) to provide a purge gas to the annular purge gas channel. Any suitable purge gas such as nitrogen, argon, or helium, may be used alone or in combination. In operation, the purge gas flows through the purge gas conduit, into the annular purge gas channel, and about an edge of the substrate disposed on the support member 220. Accordingly, the purge gas working in cooperation with the edge ring prevents deposition at the edge and/or backside of the substrate.

The temperature of the substrate support surface of the substrate support assembly 240 can also be controlled by a fluid circulated through a fluid channel embedded within the body of the support member 220. In one or more embodiments, the fluid channel is in fluid communication with a heat transfer conduit disposed through the shaft 222 of the substrate support assembly 240. The fluid channel is disposed inside and about the support member 220 to provide a desired heat transfer to the substrate receiving surface of the support member 220. The fluid channel and the heat transfer conduit can flow heat transfer fluids to either heat or cool the support member 220. Any suitable heat transfer fluid may be used, such as water, nitrogen, ethylene glycol, or mixtures thereof.

The support member 220 can be moved vertically within the chamber body 202 so that a distance between support member 220 and the lid assembly 204 can be controlled. A sensor (not shown) can provide information concerning the position of support member 220 within the process chamber 200. In operation, the support member 220 can be elevated to a close proximity with the lid assembly 204 to control the temperature of the substrate being processed. As such, the substrate can be heated via radiance heating emitted from the distribution plate of the lid assembly 204 or a heating element 212 embedded within the support member 220 of the substrate support assembly 240. Alternatively, the substrate can be lifted off the substrate support surface of the support member 220 to be in close proximity of the heated lid assembly 204 using the lift pins activated and moved by the lift ring.

One or more embodiments of the invention provide the use of a heating element within a substrate support assembly, where multiple heating element sections (e.g., two or more heating element sections) of the heating element are connected together in one electrical loop. Advantageously, the heating element sections are configured in different geometry, patterns, shapes, sizes, and materials which heated up independently for controlling the temperatures of the multiple zones of a substrate support surface of the support member, thus providing a desired temperature profile among various center or outer portions of a surface of a substrate. The heating element sections are generally located at different radial distances from a centerline of the substrate support assembly, for example by configuring the heating element in a spiral, by doubling the heating element back (i.e., changing the direction in which the heating element is run, for example, utilizing a 180 degree turn). Having the multiple heating element sections comprising the single heating element positioned at different radial distances within the substrate support assembly allows for the single heating element to be controlled by a power input source and yet provide independent control of output temperature and heating efficiency among the multiple heating element sections of the heating element, thereby creating multiple radially spaced adjustable temperature control zones.

According to one embodiment of the invention, a minimum of one heating element may be provided within the substrate support assembly 240 for heating the surface of the substrate 110 (e.g., the heating element 212 in FIG. 2B is shown to be embedded within the support member 220 of the substrate support assembly 240) and is configured (as discussed in detail below) into multiple temperature-adjustable heating zones where the output temperature in each of the multiple heating zones can be adjustably controlled and obtained. Additional heating elements may be provided, but may not be required.

In one embodiment, the heating element 212 may be a resistive heating element comprises of a resistive material, e.g., an internal resistive wire surrounded by a thickness of a filler material. The support assembly 220 can further include a thermocouple (not shown) embedded therein for monitoring the temperature of the substrate support surface of the support member 220. For example, a signal from the thermocouple may be used in a feedback loop to control the electric current, power input levels and frequencies applied to the heating element 212 and/or the flow rate of a heat transfer fluid or a coolant or a cooling medium circulated through the fluid channel embedded within the support member 220, thereby adjusting the output temperature of the substrate support surface of the support member 220.

In one example, the heating element 212 may be connected to a power input line 226A and a power outline line 226B of a power source 214 for heating the substrate 110 disposed on the substrate surface of the support member 220 of the substrate support assembly 240. The power input line 226A and the power outline line 226B are generally disposed within the shaft 222. Advantageously, when one single heating element is used, only one single power source is required, thus reducing the software control and hardware burdens of controlling multiple power sources. In addition, a minimum of two power lines for one single heating element is packed within the shaft 222 without the need to pack lots of power lines inside the shaft, as seen in prior art substrate supports using multiple heating elements.

In general, the heating element 212 converts electricity into heat through the process of Joule heating. Electric current passing through the heating element 212 may encounter resistance, thus resulting in heating of the heating element 212. The heating element 212 may include a central portion of a wire, ribbon or strip, which may comprise a resistive material, including, but not limited to, nickel, chromium, iron, aluminum, copper, molybdenum, platinum silicon carbide, their metal alloys, their nitride materials, their silicide materials, and combinations thereof, among others. The resistive material may be alloys of different metal materials and may be doped with metal dopants or other dopant materials. The resistive heating wires, ribbons, or strips may be in the shape of straight or coiled. The filler material may be any of the ceramic materials or oxide materials that provide insulation and prevent electric leakage.

For example, resistive heating wires or ribbons may be made of a Nichrome 80/20 (80% nickel and 20% chromium) material. Nichrome 80/20 is an ideal material, because it has relatively high resistance and forms an adherent layer of chromium oxide when it is heated for the first time. Material beneath the layer of chromium oxide will not oxidize, preventing the wire from breaking or burning-out.

In addition, Kanthal (FeCrAl) and Cupronickel (CuNi) and their alloys are good materials for low temperature heating. Molybdenum disilicide ($MoSi_2$, molybdenum silicide, or $MOSI_2$) intermetallic compound is a silicide of molybdenum and is a refractory ceramic that can be used within a heating element. Molybdenum disilicide has moderate density, a melting point at 2030 degrees Celsius, and is electrically conductive. At high temperatures molybdenum disilicide forms a passivation layer of silicon dioxide, protecting it from further oxidation.

As another example, molybdenum disilicide can be doped with aluminum (Al) to form aluminum doped molybdenum disilicide or $Mo(SiAl)_2$, which is also a refractory ceramic that can be used within a heating element. At high temperatures aluminum doped molybdenum disilicide forms a passivation layer of alumina ($Al_2O_3$) protecting it from corrosion or further oxidation. The melting temperature of aluminum doped molybdenum disilicide is 300 degrees Celsius higher in reducing atmosphere than the melting temperature of molybdenum disilicide ($MoSi_2$).

Other materials suitable for use as the heating element 212 include screen-printed metals (which can be insulated with ceramic materials), etched metal foil (which is produced by a subtractive photo-etching process into a continuous sheet of metal foil with a complex resistance pattern), and a tubular coil nickelchrome wire (often known by the trademark "Calrod") in a ceramic insulating binder (MgO or alumina powder) sealed inside a tube made of stainless steel or brass as a straight rod or curved to span an area to be heated. In addition, positive thermal (PTC) ceramic materials having positive thermal coefficients of resistance (as compared to having negative thermal coefficients for most ceramics) can also be used. This class of ceramic material (e.g., barium titanate and lead titanate composites)) has a highly nonlinear thermal response, being extremely resistant above a composition-dependent threshold temperature and causing the material to act as its own thermostat such that when connecting to an electric current (turned on), the electric current can pass when its temperature is low (cool), and cannot pass when it is hot. In addition, these PTC ceramic materials can be made into thin films and/or in various shapes.

In one or more embodiments, the heating element 212 is configured into multiple portions (e.g., at least four (4) heating element sections 212A, 212B, 212C, 212D are shown in FIG. 2B), thus one single heating element is capable of providing multiple temperature zones on the substrate support surface of the support member 220 of the substrate support assembly 240. In one example, the heating element sections 212A, 212B, 212C, 212D of the heating element 212 are configured to provide at least four (4) heating zones "A", "B", "C", and "D", wherein spanning across the substrate support surface of the support member 220. Each heating element section may be configured to provide heating in each heating zone the substrate support surface of the support member 220. In one embodiment, each heating element sections 212A, 212B, 212C, 212D of the heating element 212 are positions at different radial distances such that the four (4) heating zones "A", "B", "C", and "D" are defined at different radial distances from the centerline of the substrate support. In one embodiment, the heating element sections 212A, 212B, 212C, 212D are configured are concentric such that the four (4) heating zones "A", "B", "C", and "D" are concentric.

In one or more embodiments, the output temperature in each heating zone may be controlled and determined by a number of variables, for example, the size, shape, and pattern (or distribution density) of the resistive heating material or filler material in each heating element section of the heating element 212, the size, shape, pattern and geometry (or density) of each heating zone distributed on the substrate support surface of the support member 220, the input power frequency of the power source 214 and the amplitude of each power frequency, among others. As a result, the output temperatures in the multiples zones "A", "B", "C", "D", . . . , etc., of the substrate support surface of the support member 220 can be independently controlled and determined by adjusting these variables (e.g., within each of the multiple heating elements sections 212A, 212B, 212C, 212D, . . . , etc., of a single heating element 212) to obtain a desired temperature distribution on the substrate support surface of the support member 220 and thus, a resulting desirable surface temperature distribution profile on the surface of the substrate.

Figure 3A:
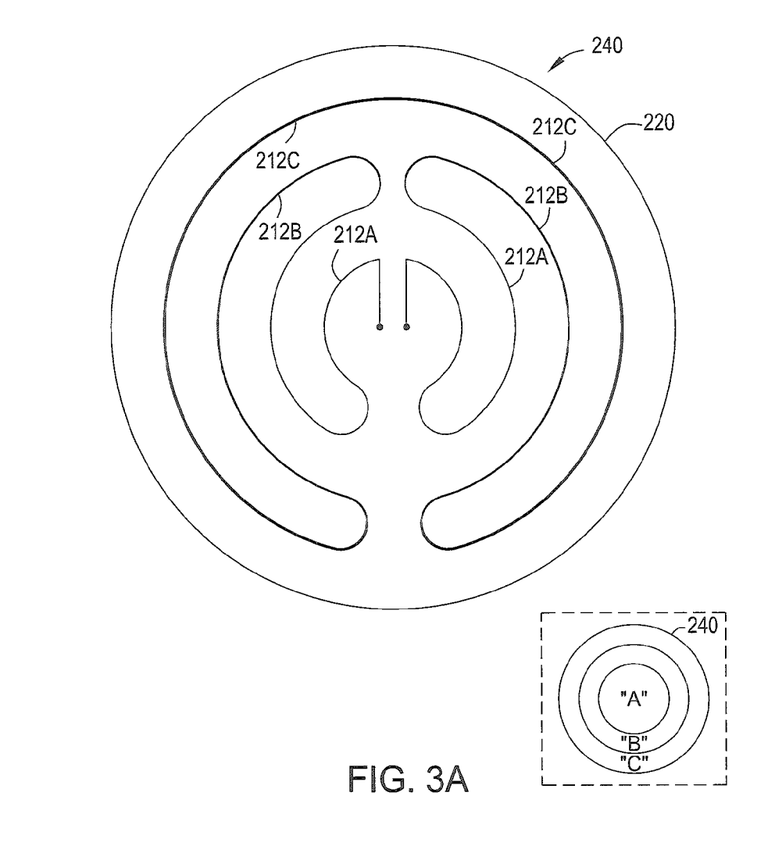
FIG. 3A depicts one embodiment of a schematic top-view diagram of a substrate support assembly with an exemplary three-zone temperature-adjustable heating pedestal, and the small box represents the surface of the substrate support assembly being adjustable into three temperature zones in accordance with one embodiment of the invention.

FIG. 3A depicts one example of the support member 220 of the substrate support assembly 240 with a three-zone temperature-adjustable heating pedestal, and the small box represents the substrate support surface of the support member 220 being adjustable into three concentric temperature heating zones "A", "B", "C". The shape of the heating zones "A", "B", "C" may be concentrically circular, or in any other suitable shapes.

In FIG. 3A, the heating element 212 embedded within the support member 220 includes at least three (3) heating element sections 212A, 212B, and 212C which are positioned at different radial distances from the centerline of the substrate support member 220, for example, by doubling back the heating element 212, by orientating the heating element 212 in a spiral, or other configuration. In one embodiment, the heating element sections 212A, 212B, and 212C may be comprised of the same resistive heating material and configured in different geometry or pattern. For example, the heating element section 212C or a heating element section disposed near the outer edge portions of the support member 220 may be arranged in a geometrically denser pattern than the heating element section 212A to compensate heat loss on the edge portions of the support member 220. In another embodiment, the heating element section 212C or a heating element section disposed near the outer edge portions of the support member 220 may be arranged in a coiled shape or other shape rather than a looser coil, a tubular wire, or in ribbon shape to provide higher heating efficiency in the heating zone "C" than other heating zones, and to compensate heat loss on the edge portions of the support member 220.

In one example, each heating element section 212A, 212B, 212C may be comprised of the same resistive materials for forming resistive wire, coil, ribbon (among others) in different thickness such that each heating element section can be tuned and controlled with its own responding power input resonant frequency or phase when heated (e.g., connected to a power source for heating) to generate different heating output efficiency and desired temperature distribution on the substrate support surface of the support member 220.

In another example, each heating element section 212A, 212B, 212C may be comprised of the same resistive materials but with different filler materials or concentrations such that each heating element section has its own resonant frequency or phase when heated (e.g., connected to a power source for heating) to generate different heating output efficiency and desired temperature distribution on the substrate support surface of the support member 220.

In another embodiment, each heating element section 212A, 212B, 212C may be comprised of different resistive materials or different filler materials such that each heating element section has its own responding resonant frequency or phase when heated (e.g., connected to a power source for heating) to generate different heating output efficiency and desired temperature distribution on the substrate support surface of the support member 220.

Thus, a method of heating the substrate support surface of a substrate support assembly include determining the responding power input resonant frequency in two or more heating element sections of a heating element and applying the responding power input resonant frequency to the power source connected to the heating element.

Figure 3B:
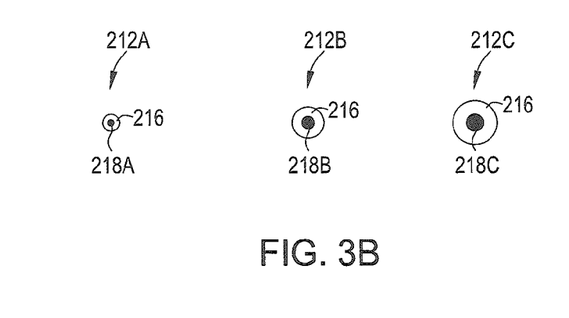
FIG. 3B depicts one embodiment of a cross-sectional view of three exemplary heating elements embedded within the substrate support assembly of FIG. 3A and capable of being adjustable into three temperature zones on the surface of the substrate support assembly.

FIG. 3B depicts one example of three heating element sections 212A, 212B, 212C for forming the heating element 212 and being embedded within the substrate support assembly 240 of FIG. 2B. In one or more embodiments, the heating element sections 212A, 212B, 212C may include an outer portion 216 and a center portion 218A, 218B, 218O, respectively, formed of different resistive materials or in different thickness, such that the heating element section 212A, 212B, 212C are capable of being controlled, adjusted or tuned into three temperature heating zones "A", "B", "C" on the surface of the substrate support assembly 240. The outer portion 216 may be comprised of the same or different filler materials. The center portion 218A, 218B, 218B may be a resistive wire, coil, ribbon, among others.

Figure 3C:
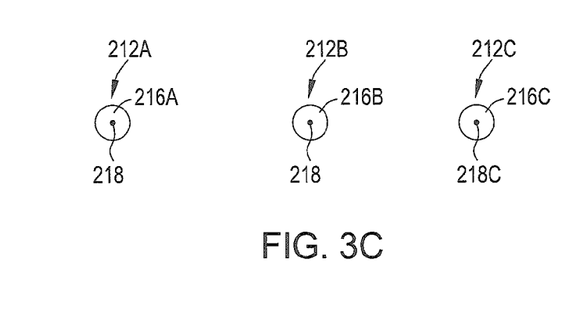
FIG. 3C depicts another embodiment of a cross-sectional view of three exemplary heating elements embedded within the substrate support assembly of a process chamber and capable of being temperature-adjustable into three zones on the surface of the substrate support assembly.

FIG. 3C depicts another example of the heating element sections 212A, 212B, 212C embedded within the substrate support surface of support member 220 within a process chamber. In this embodiment, the heating element sections 212A, 212B, 212C may include a center portion 218 and an outer portion 216A, 216B, 216C, respectively, formed of different filler materials or in different thickness, such that the heating element section 212A, 212B, 212C are capable of being controlled, adjusted or tuned into three temperature heating zones "A", "B", "C" on the surface of the substrate support assembly 240. The center portion 218 may be comprised of the same or different resistive wire, coil or ribbon materials. The out portion 216A, 216B, 216C may be controlled, tuned, or adjusted independently to generate three heating efficiencies in the temperature heating zones A", "B", "C" on the substrate support surface of the support member 220.

Referring back to FIG. 2B, the heating element 212 with two or more multiple heating element sections can be connected to the power source 214, which is connected to a controller with built-in software to tune and adjust the power input of the power source 214 applied onto each of the multiple heating element sections. Directly or indirectly, the power source 214 can be controlled by a system controller 206 or a separate controller connected to the system controller 206, which is generally used to regulate the operations of the process chamber 200. Thus, the system controller 206 can be configured, during substrate heating, to effect heating the support surface of a substrate support assembly. The system controller 206 may be configured to determine the responding power input resonant frequency in two or more heating element sections of a heating element and apply the responding power input resonant frequency to the power source connected to the heating element.

The system controller 206 may be coupled to various components of the process chamber 200 to control its substrate processing operations. Although schematically shown coupled to the process chamber 200, the system controller 206 may be operably connected to any components, such as the power supply 214, the substrate support assembly 240, various sensors and thermocouples within the process chamber 200, a gas supply (not shown) coupled to the gas inlets near the shower head 232, the one or more gas outlets 234, a vacuum pump and or throttle valve (not shown), and the like, in order to control processes performed within the process chamber 200. The system controller 206 may be one of any form of general-purpose computer processor and sub-processors that can be used in an industrial setting for controlling various process chambers and chamber parts. The system controller 206 may control the process chamber 200 directly, or via other computers or controllers (not shown) associated with particular support system components.

As shown in FIG. 2B, the system controller 206 generally comprises a central processing unit (CPU) 308, a memory 312, and support circuits 310 for the CPU 308. The memory 312 (e.g., a computer-readable medium) of the CPU 308 may be one or more of readily available memory such as random access memory (RAM), read only memory (ROM), floppy disk, hard disk, flash, or any other form of digital storage, local or remote. The support circuits 310 are coupled to the CPU 308 for support the CPU 308 in a conventional manner. These support circuits 310 include cache, power supplies, clock circuits, input/output circuitry and subsystems, and the like.

Inventive methods as described herein may be stored in the memory 312 as a software routine 314 that may be executed or invoked to turn the system controller 206 into a specific purpose controller to control the operation of the process chamber 200 and adjust the power input (frequencies, amplitudes, power levels, etc.,) of the power supply 214 and control the heating efficiency and temperature distribution on the substrate support surface of the substrate support assembly 240, thereby effecting improved heating efficiency and desired temperature distribution across a surface of a substrate disposed within process chamber 200 according to the manner described herein. The software routine may also be stored and/or executed by a second CPU (not shown) that is remotely located from hardware controlled by the CPU 308.

The memory 312 may include instructions that enable a tuning and temperature adjusting process described herein to be performed on the process chamber 200. For example, the computer program can dictate the heating and cooling sequencing and timing, wafer cooling, in-flow and out-flow of various gases and mixture of gases, chamber pressures, RF power levels, the positioning of the shaft and support member of the substrate support assembly, the positioning of lift pins, slit valve opening and closing and other variables and parameters.

Figure 4:
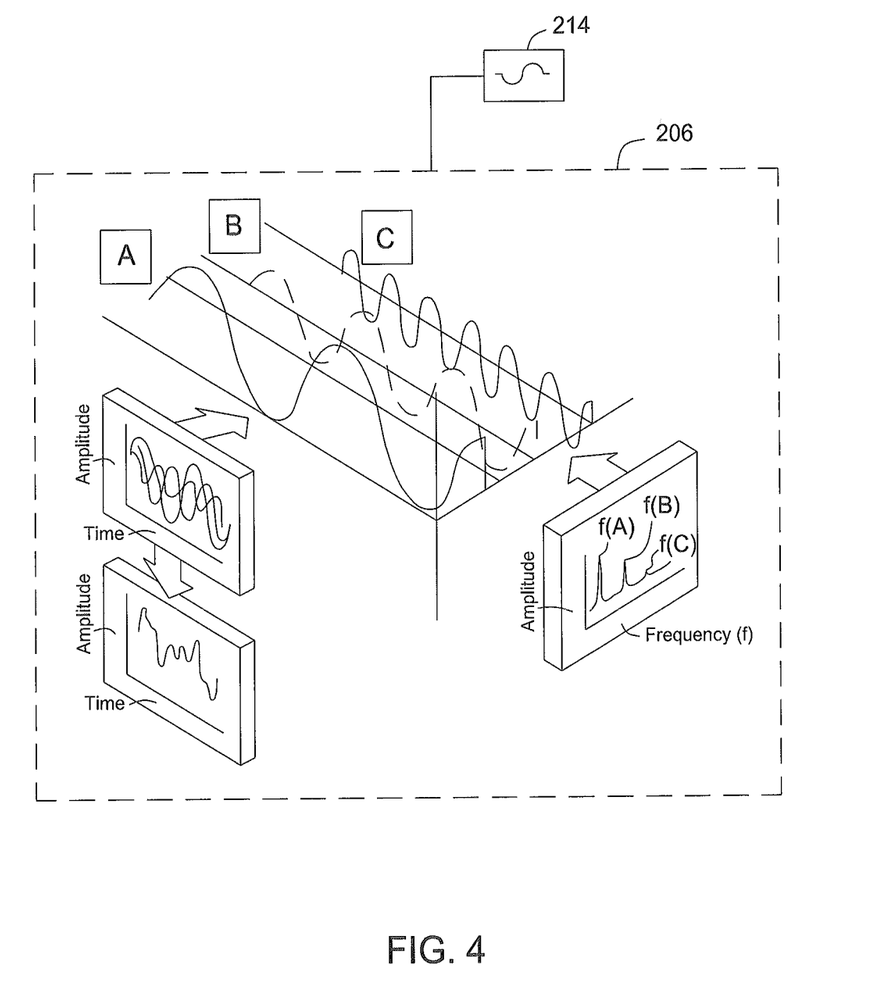
FIG. 4 depicts a schematic view of one embodiment of three different resulting heating outputs obtained by adjusting the frequencies or the amplitudes of the power inputs of three exemplary heating elements.

FIG. 4 depicts one example of tuning the heating outputs of the two or more heating element sections or any other number of multiple heating element sections (e.g., heating element sections 212A, 212B, 212C) in a heating element (e.g., the heating element 212), to provide a desired temperature distribution among the heating zones "A", "B", "C", etc. on the substrate support surface of a substrate support assembly. In one example, a modulator connected to the power source and the system controller 206 can be used to adjust the power source 214, such as to adjust the frequencies of the power inputs applied to the heating element sections 212A, 212B, 212C, and three different resulting heating output levels are obtained.

In another example, three different resulting heating output levels are obtained by adjusting the amplitude of each specific frequency f(A), f(B), f(C) that each heating element section 212A, 212B, 212C may respond to, respectively (e.g., the heating element section 212A responds to power input with frequency f(A), the heating element section 212B responds to power input with frequency f(B), and the heating element section 212C responds to power input with frequency f(C)). By adjusting the amplitude of each frequency, the temperature of each heating zone "A", "B", "C" (as illustrated in FIG. 2B) can be adjusted independently. Additional ways of adjusting the peak amplitude of each frequency and thus varying the temperature of the corresponding heating zone can be used to achieve desirable temperature distribution profiles.

Therefore, by independently adjusting the temperature of each heating zone on a substrate support surface of a substrate support assembly, the temperature distribution profile on a surface of a substrate disposed on the substrate support assembly can be optimized and obtained. As discussed above, optionally, cooling channels or coolant fluids can also be integrated to the heating mechanism of the substrate support assembly to remove any excessive heat generated by the heating element or the heating element sections and keep the heating element under control (even when the power source connected to the heating element is turned on at a power input of more than 0.01%), while manipulating the temperature of each heating element section (corresponding to each heating zone) to achieve desired temperature distribution on a surface of a substrate.

Accordingly, the invention provide a simple and clean way to efficiently and independently control the temperature of a substrate disposed inside the process chamber eliminating unnecessary and bulky parts, such as multiple power lines, cables and power leads. For a heating system which include at least a heating element incorporated in a substrate support assembly to provide substrate heating in multiple (N) number of heating zones, it is estimated that the cost for designing and installing about N−1 sets of cables and heating element leads. N−1 sets power supply units are saved. In addition, when less chamber parts are used, the potential chamber down time and defaults due to malfunctioning of these multiple sets of cables, leads and power supply units are greatly reduced.

The process chamber 200 may be coupled to a multi-chamber substrate processing system (e.g., a cluster substrate processing tool) that can be adapted to perform various processes in multiple process chambers. Each process chamber within the substrate processing system is configured to perform at least one of substrate processing operations, such as chemical vapor deposition (CVD), cyclical layer deposition (CLD), atomic layer deposition (ALD), physical vapor deposition (PVD), etch, degas, dry etch, pre-clean, orientation and other substrate processes. The substrate processing system can also include one or more load lock chambers for transferring substrates into and out of the substrate processing system.

A transfer robot can transfer the substrates between the load lock chambers and/or a first set of one or more process chambers, and other chambers. The transfer robot can also transfer substrates to/from one or more transfer chambers. The transfer chambers can be used to maintain ultrahigh vacuum conditions while allowing substrates to be transferred within the substrate processing system. Another transfer robot can transfer the substrates between the transfer chambers and/or a second set of one or more process chambers.

While the foregoing is directed to embodiments of the present invention, other and further embodiments of the invention can be devised without departing from the basic scope thereof, and the scope thereof is determined by the claims that follow.

The invention claimed is:

1. A substrate support assembly in a substrate process chamber, comprising:
   a support member comprising a substrate support surface; and
   a heating element comprising two or more heating element sections; wherein the heating element sections are connected together in one electrical loop, and wherein each heating element section responds independently and differently to an input power of a power source connected to the heating element.

2. The substrate support assembly of claim 1, wherein the heating element is provided to heat the substrate support surface in two or more heating zones, and each heating element section is independently configured to heat each heating zone on the substrate support surface of the support member.

3. The substrate support assembly of claim 1, wherein each heating element section responds to an input power frequency, and wherein the output temperature of the substrate support surface is determined by adjusting two or more input power frequencies of the power source.

4. The substrate support assembly of claim 1, wherein the output temperature in each heating element section is determined by an amplitude of an input power frequency of the power source, and wherein the output temperature of the substrate support surface is controlled by adjusting the amplitude of the power frequency.

5. The substrate support assembly of claim 1, wherein each heating element section comprises a resistive heating material selected form the group consisting of nickel, chromium, iron, aluminum, copper, molybdenum, platinum silicon carbide, their metal alloys, their nitride materials, their silicide materials, and combinations thereof.

6. The substrate support assembly of claim 1, wherein each heating element section comprises a resistive heating material in a shape selected form the group consisting of a wire, a foil or a ribbon.

7. The substrate support assembly of claim 1, wherein each resistive element section comprises a filler material in different sizes and shapes.

8. The substrate support assembly of claim 1, wherein the two or more resistive element sections are formed differently according to a variable in each heating element section, the variable being selected form the group consisting of the size, shape, pattern, distribution density of a resistive heating material, the size, shape, pattern, distribution density of a filler material, thereby effecting different output temperatures in the two or more resistive element sections when the power source connected to the heating element is on.

9. A substrate process chamber, comprising:
   a substrate support assembly disposed inside the substrate process chamber; wherein the substrate support assembly comprising:
   a support member comprising a substrate support surface; and
   a heating element comprising two or more heating element sections, wherein the heating element sections are connected together in one electrical loop, and wherein each heating element section responds independently and differently to an input power of a power source connected to the heating element.

10. The substrate process chamber of claim 9, wherein the heating element is provided to heat the substrate support surface in two or more heating zones, and each heating element section of the heating element is independently configured to heat each heating zone on the substrate support surface of the support member.

11. The substrate process chamber of claim 9, wherein the substrate process chamber is selected from the group consisting of etch chambers, cleaning chambers, CVD chambers, PVD chambers, ALD chambers, and combinations thereof.

12. The substrate process chamber of claim 9, wherein each heating element section responds to an input power frequency, and wherein the output temperature of the substrate support surface is determined by adjusting two or more input power frequencies of the power source.

13. The substrate process chamber of claim 9, wherein the output temperature in each heating element section is determined by an amplitude of an input power frequency of the power source, and wherein the output temperature of the substrate support surface is controlled by adjusting the amplitude of the power frequency.

14. The substrate process chamber of claim 9, wherein each heating element section comprises a filler material and a resistive heating material selected form the group consisting of nickel, chromium, iron, aluminum, copper, molybdenum, platinum silicon carbide, their metal alloys, their nitride materials, their silicide materials, and combinations thereof.

15. The substrate process chamber of claim 9, wherein each heating element section comprises a resistive heating material in a shape selected form the group consisting of a wire, a foil or a ribbon.

16. The substrate process chamber of claim 9, wherein the two or more resistive element sections are formed differently according to a variable in each heating element section, the variable being selected form the group consisting of the size, shape, pattern, distribution density of a resistive heating material, the size, shape, pattern, distribution density of a filler material, thereby effecting different output temperatures in the two or more resistive element sections when the power source connected to the heating element is on.

17. A method of heating a surface of a substrate in a process chamber, comprising:
   heating a substrate support surface of a substrate support assembly having the substrate disposed thereon, wherein the substrate support assembly comprising a heating element comprising two or more heating element sections, wherein the heating element sections are connected together in one electrical loop, and wherein each heating element section responds differently to an input power of a power source connected to the heating element;
   determining a responding power input resonant frequency in the two or more heating element sections of the heating element; and
   applying the responding power input resonant frequency to the power source connected to the heating element.

18. The method of claim 17, further comprising:
   adjusting the amplitude of each responding power input resonant frequency for each heating element section.

19. The method of claim 17, further comprising:
   independently heating each heating element section of the heating element, wherein each heating element section correspond to each of two or more heating zones on the substrate support surface; and
   providing a desired output temperature distribution across the two or more heating zones on the substrate support surface of the substrate support assembly.

20. The method of claim 17, further comprising:
flowing a cooling medium circulated through a fluid channel embedded within the substrate support assembly; and
adjusting the output temperature of the substrate support surface of the substrate support assembly.

* * * * *

UNITED STATES PATENT AND TRADEMARK OFFICE
CERTIFICATE OF CORRECTION

PATENT NO. : 9,089,007 B2  
APPLICATION NO. : 13/766885  
DATED : July 21, 2015  
INVENTOR(S) : Yang et al.

Page 1 of 1

It is certified that error appears in the above-identified patent and that said Letters Patent is hereby corrected as shown below:

In the Specification:

Column 12, Line 25, please delete "2180" and insert --218C-- therefor;

Column 12, Line 48, please delete "A"" and insert --"A"-- therefor;

Column 14, Line 8, please delete "2120" and insert --212C-- therefor;

In the Claims:

Column 15, Claim 1, Line 8, please delete "in" and insert --for-- therefor.

Signed and Sealed this  
Tenth Day of November, 2015

Michelle K. Lee  
*Director of the United States Patent and Trademark Office*